(12) United States Patent
Mareljic et al.

(10) Patent No.: US 9,374,906 B2
(45) Date of Patent: Jun. 21, 2016

(54) METHOD FOR PRETREATING A FRAME OR CARRIER ELEMENT FOR MAKING A CIRCUIT BOARD, AND THE FRAME OR CARRIER ELEMENT

(75) Inventors: Ljubomir Mareljic, Shanghai (CN); Anderson Zhang, Shanghai (CN)

(73) Assignee: AT & S AUSTRIA TECHNOLOGIE & SYSTEMTECHNIK AKTIENGESELLSCHAFT, Leoben-Hinterberg (AT)

( * ) Notice: Subject to any disclaimer, the term of this patent is extended or adjusted under 35 U.S.C. 154(b) by 1258 days.

(21) Appl. No.: 13/264,221

(22) PCT Filed: Apr. 14, 2010

(86) PCT No.: PCT/AT2010/000103
§ 371 (c)(1),
(2), (4) Date: Oct. 13, 2011

(87) PCT Pub. No.: WO2010/121277
PCT Pub. Date: Oct. 28, 2010

(65) Prior Publication Data
US 2012/0038094 A1    Feb. 16, 2012

(30) Foreign Application Priority Data
Apr. 20, 2009    (AT) ................. GM 246/2009

(51) Int. Cl.
*H05K 3/36*    (2006.01)
*H05K 3/00*    (2006.01)
*H05K 3/34*    (2006.01)

(52) U.S. Cl.
CPC ............. *H05K 3/0097* (2013.01); *H05K 3/341* (2013.01); *H05K 2203/0165* (2013.01); *H05K 2203/0169* (2013.01); *H05K 2203/1105* (2013.01)

(58) Field of Classification Search
CPC ...... C23C 26/00; C25D 7/0614; H05K 3/025; H05K 3/0097; H05K 3/341; H05K 2203/1105; H05K 2203/0169; H05K 2203/0165
USPC ............ 29/830, 831, 846, 848, 849; 156/230, 156/233; 174/255, 256; 428/457, 458
See application file for complete search history.

(56) References Cited

U.S. PATENT DOCUMENTS 4,689,103 A    8/1987    Elarde
5,044,615 A    9/1991    Newman
(Continued)

FOREIGN PATENT DOCUMENTS

CN    85 1 07077 A    10/1986
DE    19600928    7/1997
(Continued)

OTHER PUBLICATIONS

Japanese Notice of Rejection of Jul. 9, 2013 issued to a corresponding Japanese patent application.
(Continued)

*Primary Examiner* — Donghai D Nguyen
(74) *Attorney, Agent, or Firm* — Jacobson Holman, PLLC.

(57) ABSTRACT

In a method for pre-treating a frame or carrier element for use in the production of a printed circuit board, wherein after the pre-treatment the frame or carrier element is coupled with at least one circuit board element and subjected to at least one processing or treatment step, particularly at an elevated temperature, together with the circuit board element, in particular mounting or populating of the circuit board element, it is provided that the frame or support or carrier element is subjected to a heat treatment at temperatures between 120° C. and 350° C., in particular 200° C. to 300° C., for a time period ($t_{tot}$) of 5 to 300 seconds, in particular 10 to 200 seconds, whereby frame or carrier elements can be provided, which are reliably stable in terms of shape and dimensions.

19 Claims, 4 Drawing Sheets

(56) References Cited

U.S. PATENT DOCUMENTS

| | | |
|---|---|---|
| 5,785,307 A | 7/1998 | Chung |
| 6,152,353 A | 11/2000 | Sani-Bakhtiari |
| 6,164,636 A | 12/2000 | Taylor |
| 6,574,862 B1 * | 6/2003 | Choi .................. B01F 5/10 29/827 |
| 6,649,274 B1 * | 11/2003 | Taenaka et al. ............ 428/457 |
| 6,899,781 B2 * | 5/2005 | Seita et al. ................ 156/233 |
| 2005/0001019 A1 | 1/2005 | Goenka |
| 2007/0209828 A1 | 9/2007 | Vigil |

FOREIGN PATENT DOCUMENTS

| | | |
|---|---|---|
| EP | 0 178 170 A2 | 4/1986 |
| EP | 0 508 977 | 10/1992 |
| EP | 0 804 990 | 11/1997 |
| EP | 1 980 601 | 10/2008 |

OTHER PUBLICATIONS

Chinese Office Action of Jun. 25, 2014 issued to a corresponding Chinese patent application.

Chinese Office Action of Mar. 13, 2015 issued to a corresponding Chinese patent application.

* cited by examiner

METHOD FOR PRETREATING A FRAME OR CARRIER ELEMENT FOR MAKING A CIRCUIT BOARD, AND THE FRAME OR CARRIER ELEMENT

This is a national stage of PCT/AT2010/000103 filed Apr. 14, 2010 and published in German, which has a priority of Austria no. GM 246/2009 filed Apr. 20, 2009, hereby incorporated by reference.

FIELD OF THE INVENTION

The invention relates to a method for pre-treating a frame or support or carrier element for use in the production of a printed circuit board, wherein the frame or support element is coupled with at least one printed circuit board element after pre-treating and subjected to at least one processing step, particularly at elevated temperature, together with the printed circuit board element, in particular mounting of the printed circuit board element. The present invention, moreover, relates to such a frame or support or carrier element for use in the production of a printed circuit board as well as the use of such a frame or support element.

PRIOR ART

In the context of the production of printed circuit boards, it is known to produce a plurality of printed circuit boards or printed circuit board elements as a combined plate-shaped element, such printed circuit boards, as a rule, being each comprised of a plurality of conductive and insulating layers and/or of components integrated in such printed circuit boards. According to known production methods of this type, a substantially full-surface assembly of a plurality of printed circuit boards on the collective plate-shaped element is effected, whereupon, after the completion of the printed circuit boards, the latter are separated from one another. In those cases, each of the printed circuit boards has a respective edge region about its periphery, and hence outside a substantially central region forming an actual printed circuit board element, in which the structures for the formation of the printed circuit board and/or the electronic component are integrated. Said edge region is provided for carrying out further printed circuit board processing steps, for instance, in the context of the insertion of components to be fixed to at least one surface and/or the installation into an electric or electronic device, in order to enable the manipulation and, in particular, the automatic seizure of such a printed circuit board during subsequent treatment or processing steps. According to presently known process controls, it is thus to be anticipated that the peripheral region to be provided for the frame or the peripheral region of the printed circuit board is likewise produced of a usually expensive material in accordance with the usually multi-layered printed circuit board. Such an edge or peripheral region, which is not required for the functioning of the printed circuit board, will however, result in elevated costs of such a printed circuit board, considering the usually multi-layered structure made of expensive materials. In addition, it is to be anticipated that, in the context of known production methods of printed circuit boards, regions or areas located between individual printed circuit board elements, of the collective plate-shaped element are discarded as waste such that elevated costs for the production of the printed circuit boards or printed circuit board elements will also occur in this respect.

In connection with the production of printed circuit boards, it is, moreover, known to remove individual, defective printed circuit boards from a collective plate-shaped element if these are recognized as defective during tests or checks, and to insert individual printed circuit boards in place of such removed, defective printed circuit boards in order to enable a maximum quantity of printed circuit board elements to be processed in collective processing steps during subsequent treatment or processing steps and, in particular, during subsequent mounting.

In addition, methods for collectively processing and handling printed circuit boards are known, according to which several printed circuit boards or printed circuit board elements are usually inserted into frame elements each surrounding the printed circuit boards about their entire peripheries, and are fixed to them, for instance, by bonding. In this respect, it is, for instance, referred to DE-A 196 00 928, U.S. Pat. No. 4,689,103 or U.S. Pat. No. 5,044,615. Those known methods for inserting printed circuit boards into a frame element at least partially, and in particular each completely, surrounding the printed circuit boards, in particular, involve the drawback that reception openings to be provided in the frame element for the arrangement of the printed circuit boards have to be precisely adapted to the dimensions of the printed circuit boards to be inserted, and the proper fixation, for instance by bonding, to the peripheral edges of the printed circuit boards and frame elements, which usually have comparatively small thicknesses, is therefore extremely difficult and elaborate.

When coupling at least one printed circuit board element each with a frame or support element, it may be provided, particularly as a function of subsequent treatment or processing steps, that a detachable coupling is realized between the frame or support element and the printed circuit board element such that, after further processing steps, e.g. mounting, the frame or support element is again removed from the printed circuit board element, and a printed circuit board element thus freed of the frame or support element will be inserted into an electronic device.

Besides, it is also possible to provide a permanent connection or coupling between a frame or support element and a printed circuit board element even after necessary treatment procedures such as, e.g., mounting, for instance by bonding, so that a combination of a frame or support element and a printed circuit board element will subsequently, for instance, be installed in a device. When providing larger frame or support elements, which serve to receive a plurality of printed circuit board elements, the separation into individual printed circuit board elements will be enabled by the appropriate separation or fragmentation into individual subunits, of the frame or support element comprising a plurality of printed circuit board elements, said subunits each being merely comprised of a portion of the frame or support element and one printed circuit board element for further use.

For the last-mentioned methods, in which frame or support elements are each connected with a plurality of printed circuit board elements to be processed in subsequent processing steps and, in particular, mounting steps, it is, moreover, known that, under special consideration of the elevated temperatures occurring during subsequent processing steps, e.g. in the connection with soldering processes, shrinking or, in general, changes in the dimensions of both the printed circuit board elements and the frame or support elements at least partially surrounding the same will occur. In this respect, it is departed from the fact that such dimensional changes will, in particular, result from the evaporation or escape of moisture absorbed by the materials, during such treatment or processing steps under elevated temperature. This will not only entail dimensional changes and possible deformations both of the printed circuit board elements and of the frame or support elements connected therewith. It will, moreover, have to be taken into account that, despite the fact that such frame or support elements are formed of materials usually used in the production of printed circuit boards, the printed circuit board elements as well as the frame or support elements will, as a rule, exhibit different material properties, and hence different dimensional changes during processing under elevated temperature. These different material properties, for instance, result from the fact that printed circuit board elements comprise at least one embedded layer or ply of an accordingly dimensionally stabler metallic material, particularly copper, and usually a plurality of such embedded metallic layers, while a cost-effective frame or support material, as indicated above, does not comprise such additional metallic layers, or only in a strongly reduced number of, for instance, two layers at the most. Such a strongly reduced number of metallic layers may, for instance, serve to provide markings or registration elements. Insulating materials employed for the production of printed circuit boards under elevated temperature usually exhibit increased dimensional changes and hence reduced dimensional stabilities.

SUMMARY OF THE INVENTION

The present invention, therefore, aims to provide a method of the initially defined kind as well as a frame or support element for use in the production of a printed circuit board, wherein the above-mentioned drawbacks and problems of the prior art, in particular with regard to the use in further treatment or processing steps, particularly under elevated temperature, will be avoided or at least minimized, and to provide a frame or support element which, in particular, exhibits an elevated dimensional stability when used during subsequent treatment or processing steps in the production of printed circuit boards.

To solve these objects, the method according to the invention of the initially defined kind is essentially characterized in that the frame or support element is subjected to a heat treatment at temperatures of between 120° C. and 350° C., in particular 200° C. to 300° C., for a period of 5 to 300 seconds, in particular 10 to 200 seconds. Due to the fact that, according to the invention, the frame or support element is subjected to a heat treatment or pre-treatment under elevated temperature for a given period of time, it will be ensured that materials optionally causing a shrinkage or, in general, a dimensional change of the frame or support element will be removed from the frame or support element such that an accordingly dimensionally stable frame or support element will be provided for subsequent treatment or processing steps after the, particularly detachable, coupling with usually a plurality of printed circuit board elements. By providing an accordingly dimensionally stable frame or support element by the method according to the invention, it will be ensured during subsequent treatment or processing steps and, in particular, under elevated temperatures that a distortion or twist of the interconnected elements will be avoided in subsequent processing steps, particularly when considering the optionally different material properties during subjection to elevated temperatures between the printed circuit board elements and the frame or support element(s) connected therewith.

By providing such a dimensionally stable frame or support element, it has thus become possible to provide larger arrays or panels including increased numbers of printed circuit board elements to be each processed in a collective treatment step, such larger arrays allowing for the mounting or, in general, processing of an increased number of printed circuit boards while, for instance, providing just one marker.

Thus, a small number of markers or fiducials can be used for the whole array. Due to the fact that dimensionally stable frame or support elements produced by the method according to the invention exhibit significantly reduced dimensional changes, such frame or support elements can be extended or enlarged while still complying with the process tolerances to be observed in subsequent treatment or processing steps.

However, with presently known materials for frame or support elements, which exhibit accordingly increased dimensional changes as pointed out above, attempts have been made to avoid the problem of large dimensional changes in order to comply with process tolerances in that markers are provided on each printed circuit board element to be processed, wherein such additional markers will accordingly reduce the throughput of known subsequent processes. The dimensionally stable frame or support element provided by the invention, in which a reduced number or registrations will do for a plurality of printed circuit board elements to be treated simultaneously, thus permits an increased throughput.

By providing such a dimensionally frame or support element, it will, moreover, be feasible to increase the distance between individual printed circuit board elements so as to permit treatment or mounting steps, which for the time being can only be carried out separately for individual printed circuit board elements because of the slight distances between individual printed circuit board elements, to be simultaneously performed in a single processing or mounting procedure on a single array for a plurality of printed circuit board elements by using a dimensionally stable frame or support element treated in accordance with the invention.

Printed circuit board elements to an increasing extent are, moreover, mounted with electronic components or similar elements from either surface or side. One such processing procedure usually provides the mounting of the appropriate plurality of printed circuit board elements from one side or surface, followed by a processing or treatment under elevated temperature, for instance a reflow soldering process. After such mounting of one side, the array comprising a plurality of printed circuit board elements and at least one frame or support element is turned, and mounting of the other sides or surfaces of the plurality of printed circuit board elements will take place, again followed by a processing step under elevated temperature and, in particular, a reflow soldering process. By providing a dimensionally stable frame or support element according to the invention, it will be ensured that, despite a multiple heat treatment and the turning process required for mounting from both sides, the relative positions of the individual printed circuit board elements to be mounted will be maintained within the slight tolerance ranges specified for the manufacture of printed circuit board elements. These tolerance ranges are, for instance, from ±25-30 µm to about 50 µm over a length of 270 mm to 400 mm, so that the accuracy in the production of a plurality of printed circuit board elements will be improved by the frame or support element produced according to the invention. Such an improved accuracy and dimensional stability will, thus, reduce potential rejects in the production of printed circuit board elements, which will, in turn, result in an accordingly enhanced productivity, or lower costs, for the production of printed circuit board elements. A further enhancement of the productivity at thus reduced costs for the production of individual printed circuit board elements will also be achieved by the above-mentioned option of a simultaneous treatment or processing of an increased number of printed circuit board elements.

In order to achieve or maintain the enhanced dimensional stability of the frame or support element particularly during the production of printed circuit boards at the high temperatures occurring in soldering processes, it is proposed according to a preferred embodiment that the frame or support element is subjected to a heat treatment at a temperature of at least 210° C. for a period of 40 to 100 seconds and, in particular, at least 60 seconds. Such a heat treatment at a temperature of above 210° C. for the proposed or specified time ensures that dimensional changes of the frame or support element at the elevated temperatures occurring in subsequent steps and, for instance, required in soldering processes will be minimized or avoided.

In order to further improve the dimensional stability of the frame or support element under high temperatures, it is proposed according to a further preferred embodiment that the frame or support element is subjected to a heat treatment at a temperature of at least 250° C. for a period of at least 10 seconds.

While, as indicated above, a treatment of the frame or support element at an accordingly high temperature is required and suitable for the achievement of an accordingly enhanced dimensionally stability under elevated temperatures, it is to be anticipated that, in particular with frame or support elements having larger thicknesses, the removal of materials causing dimensional changes from the interior of the frame or support element will require an accordingly extended period of time. For such a heat treatment of also internally or more deeply located regions and the preparation of a frame or support element for the subsequent treatment at elevated temperature as indicated above, it is proposed according to a further preferred embodiment of the method according to the invention that the frame or support element is subjected to a heat treatment at a temperature of at least 140° C. and, in particular, between 150° C. and 180° C., for a period of at least 100 seconds and, in particular, 120 to 180 seconds, prior to further heating to at least 210° C.

In order to retain the structure of the heat-treated frame or support element upon subjection to a maximum or peak temperature, it is proposed according to a further preferred embodiment that the frame or support element, after a heat treatment at a maximum temperature, is cooled at a cooling rate of 3° C./s to 7° C./s and, in particular, 5° C./s at the most. By observing such controlled and, in particular, comparatively high cooling rates, it will, for instance, be prevented that, in particular, moisture, for instance, from the environment will penetrate back into the heat-treated frame or support material and again deteriorate the desired dimensional stability achieved by the heat treatment.

In order to further enhance the shape or dimensional stability of the frame or support element to be treated, it is proposed according to a further preferred embodiment that the frame or support element is subjected to a multiple heat treatment with intermediate cooling. Such a multiple heat treatment under observation of the above-identified parameters in terms of temperature and treatment time, will safeguard that, particularly after a comparatively small number of thermal treatment procedures, a dimensional stability of the frame or support element to be treated will be achievable, which will not involve any changes of dimension of the frame or support element during additional heat treatments. In this respect, is has been shown that a comparatively small number of heat treatments will provide a consistent dimensional stability, the latter being, for instance, achievable after two to three thermal treatment procedures for materials usually used in the production of printed circuit boards.

While frame or support elements which are partially made of specially prepared starting materials can be immediately subjected to the heat treatment proposed by the invention to achieve an enhanced dimensional stability, it is frequently required, departing from materials usually employed for frame or support elements and discussed in more detail below, to prepare or produce the same, in particular, in correspondence with the printed circuit board elements to be subsequently coupled. To this end, it is proposed that the frame or support element, prior to the heat-treatment, is subjected to pressing and curing and/or assembled of several layers of a starting material, as in correspondence with a preferred further embodiment of the method according to the invention. In this manner, in order to obtain the desired dimensional stability, a frame or support element to be subjected to a heat treatment can be subjected to the pressing and curing of a starting material in a prepared method or process step, or a multi-layered structure of a starting material can, for instance, also be provided for the frame or support element.

Since partially normalized standards have been specified for a check of the dimensional stability of the materials used for frame or support elements, and these standards are usually defined based on full-surface materials and, in particular, plates having specified and standardized dimensions, it is proposed according to a further preferred embodiment of the method according to the invention that a full-surface or plate-shaped base material is subjected to the heat treatment, and that the frame or support element, after cooling of the plate-shaped base material, is formed, particularly cut, out of the same. In this manner, a substantially full-surface and plate-shaped material is provided for the frame or support element to be subsequently produced and provided, which is formed, particularly cut, to the desired shape after the heat treatment and prior to coupling or connection with usually a plurality of printed circuit board elements.

In order to avoid long-term effects with regard to an optionally possible absorption of, in particular, moisture into the heat-treated frame or support element subjected to the heat treatment according to the invention, it is proposed that the frame or support element, after the heat treatment, is immediately connected or coupled with at least one printed circuit board element and subjected to processing of the printed circuit board element, as in correspondence with a further preferred embodiment of the method according to the invention. Such a connection or coupling proposed by the invention, with the at least one printed circuit board element substantially immediately after the heat treatment will safeguard that the dimensional stability of the frame or support element achieved by the heat treatment will be reliably maintained and retained during subsequent processing procedures of the printed circuit board element, which will again be performed, in particular, at elevated temperatures.

If an immediate coupling or connection with at least one printed circuit board element is not possible or provided, it is proposed according to an alternative embodiment of the method according to the invention that the frame or support element, after the heat treatment and prior to coupling with a printed circuit board element, is hermetically packaged, particularly vacuum-packed, under the exclusion of moisture, and stored. In this manner, frame or support elements can be produced and prepared substantially independently of the location of a subsequent connection or coupling for processing and, in particular, mounting printed circuit board elements, and a processing procedure, particularly mounting procedure, with a plurality of printed circuit board elements can each be provided at any selectable subsequent time while retaining the enhanced dimensional stability achieved by the method control according to the invention.

With a view to enabling the use of the heat-treated frame or support element according to the invention as promptly as possible for treatment or processing steps in the context of the production of a printed circuit board, or a storage of the same, it is proposed according to a further preferred embodiment that a connection or coupling of the frame or support element with a printed circuit board element, or packaging of the frame or support element, is effected after a maximum period of 72 hours and, in particular, 48 hours following the heat treatment.

As already pointed out above, it is proposed according to a further preferred embodiment that the frame or support element, in a manner known per se, is formed of a material suitable for the production of a printed circuit board element, in particular a glass-fiber mat material impregnated with an epoxy resin.

To achieve the initially mentioned objects, a frame or support element for use in the production of a printed circuit board is, moreover, provided, which is particularly characterized in that the frame or support element, after a pre-treatment by the method according to the invention or a preferred embodiment thereof, is coupleable with at least one printed circuit board element and subjected to at least one processing step, particularly under elevated temperature, together with the printed circuit board element, in particular mounting of the printed circuit board element, and that the frame or support element, during such a subsequent processing step in the production of a printed circuit board, comprises a dimensional stability of above ±0.02% and, in particular, above 0.01% and, in a particularly preferred manner, above 0.0075%. In this manner, a dimensionally stable frame or support element will be provided, which, after having been coupled or connected with usually an extremely large number of printed circuit board elements, will enable an accordingly reliable production or processing of such a plurality of printed circuit board elements, especially in subsequent treatment or processing steps during the production of printed circuit boards.

According to a preferred embodiment, it is proposed that the frame or support element, in a manner known per se, is formed of a material suitable for the production of a printed circuit board element, in particular a glass-fiber mat material impregnated with an epoxy resin.

Moreover, the use of a frame or support element produced by the method according to the invention, or a preferred embodiment thereof, in the production of a printed circuit board for connection and processing with at least one printed circuit board element is proposed. In this manner, printed circuit board elements can be produced in a reliable and beneficial manner and, in particular, at reduced costs.

SHORT DESCRIPTION OF THE DRAWINGS

In the following, the invention will be explained in more detail by way of exemplary embodiments schematically illustrated in the accompanying drawing. Therein.

DETAILED DESCRIPTION OF PREFERRED EMBODIMENTS

Figure 1:
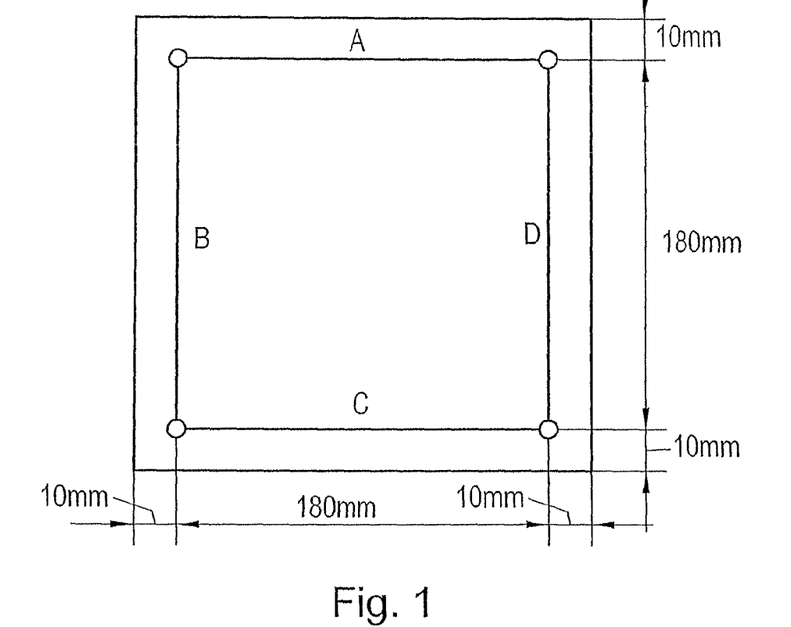
FIG. 1 is a schematic top view on a full-surface or plate-shaped base material of a frame or support element of standardized dimensions, which is subjected to a heat treatment according to the invention.

FIG. 1 is a schematic top view of a full-surface or plate-shaped base material, wherein specified dimensions are indicated for the assessment of the dimensional stability of such a material for frame or support elements, relative changes in the distances between the holes and/or changes in the overall dimensions being evaluated in the diagrams listed below. Based on such standardized dimensions of the materials used for frame or support elements, the respective method controls and achievable results will be discussed in detail hereinafter.

Figure 4:
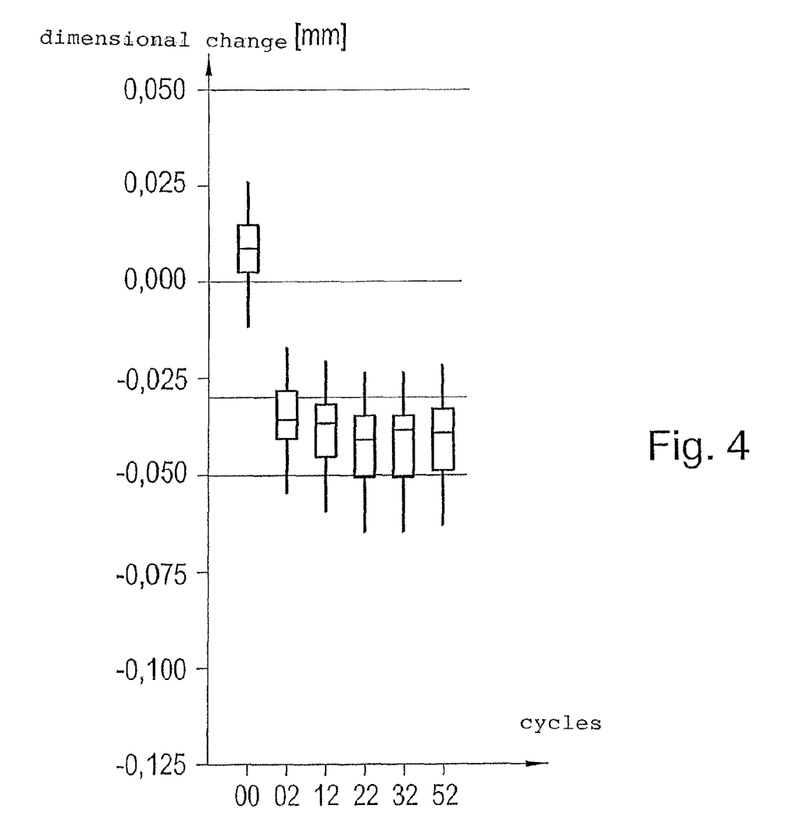
FIG. 4 is a schematic illustration of a dimensional change of frame or support elements treated by the method according to the invention, with the dimensional changes being shown after a plurality of heat treatment cycles.
Figure 5:
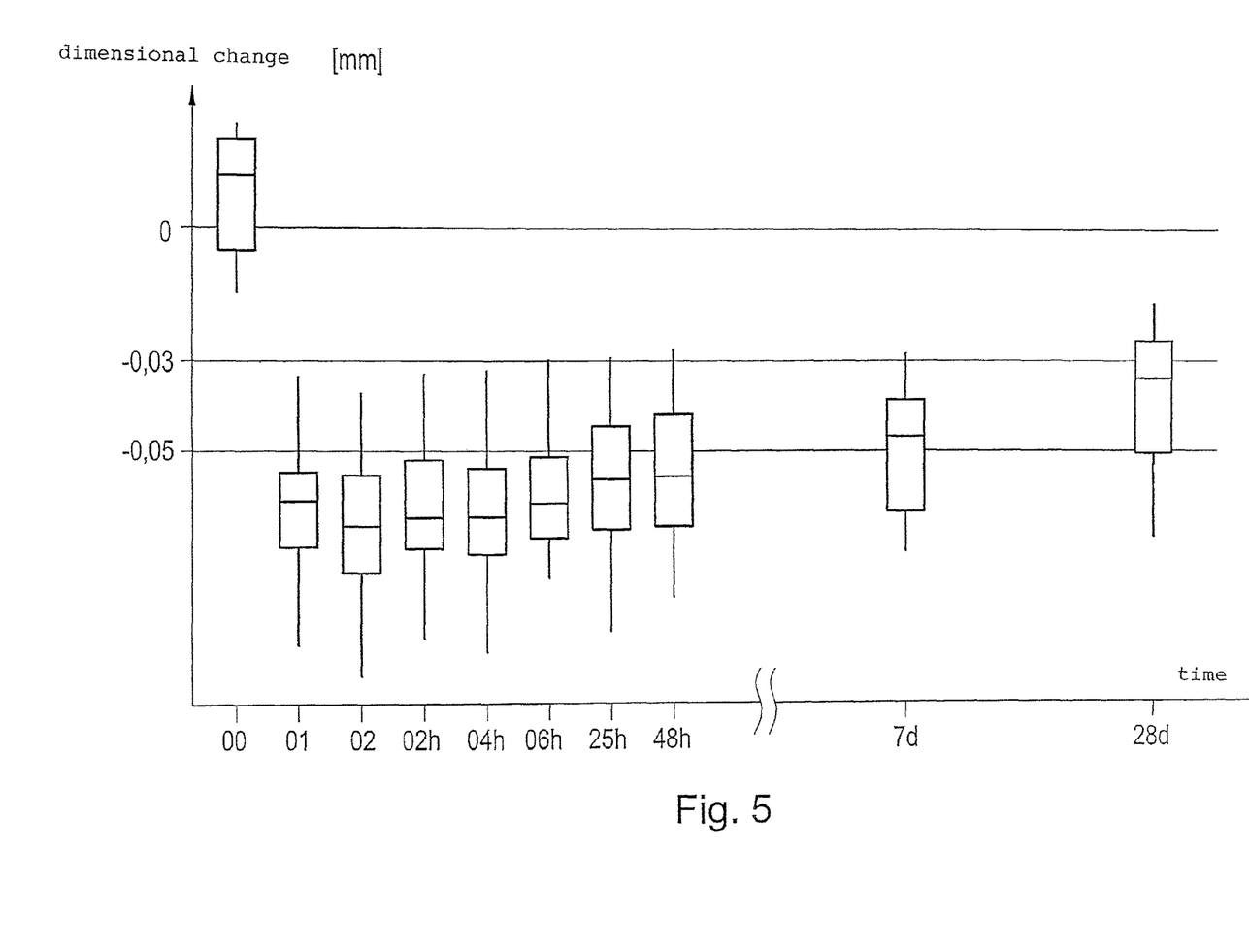
FIG. 5 is a diagram depicting the dimensional changes of frame or support elements treated by the method according to the invention, said dimensional changes of the treated frame or support elements being shown upon completion of the heat treatment.

In connection with the diagrams represented in FIGS. 4 and 5, it is noted that a plurality of material samples as used for frame or support elements were each subjected to the heat treatments discussed in detail below, wherein eight samples were usually subjected to each treatment and the mean values of the obtained results, particularly dimensional changes, as well as the determined deviations or standard deviations are indicated in FIGS. 4 and 5.

In addition, materials common for the production of printed circuit boards, in particular glass-fiber mats impregnated with epoxy resins or FR-4 materials from different manufacturers, were used for the frame or support elements, wherein the behaviors respectively illustrated in FIGS. 4 and 5 were each similar for materials sourced from different manufacturers, possibly slight differences with regard to absolute changes in dimension, in particular, having been detectable after a first heat treatment.

The frame or support elements can, moreover, be subjected to a pre-treatment such as, for instance, pressing and curing, or an assembly operation using several layers or plies.

Figure 2:
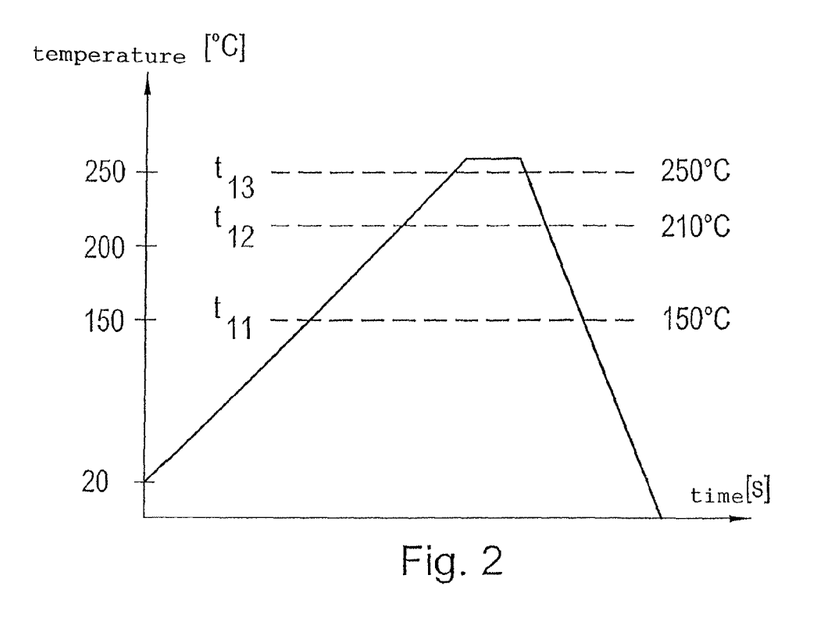
FIG. 2 is a schematic time-temperature diagram of a first method control according to the invention for the heat-treatment of a frame or support element.

From the diagram depicted in FIG. 2, which is not true to scale, it is apparent that, departing from room temperature, a substantially uniform heating of the material of the frame or support element up to a temperature of about 260° C. takes place, whereupon, after maintaining said temperature for a period of about 8-10 seconds, cooling of the material for the frame or support element at a cooling rate increased relative to the heating rate, of about 6° C./s to 7° C./s is effected.

The periods for which the indicated temperatures of at least 150° C., at least 210° C., and at least 250° C. are maintained, which are indicated in FIG. 2, are as follows:

$t_{11}$ 100 to 200 seconds
$t_{12}$ 40 to 100 seconds
$t_{13}$ at least 10 to 15 seconds.

A multiple heat treatment of the material of the frame or support element is optionally performed according to the schematic time-temperature diagram depicted in FIG. 2, as will be discussed in detail with reference to FIGS. 4 and 5.

Figure 3:
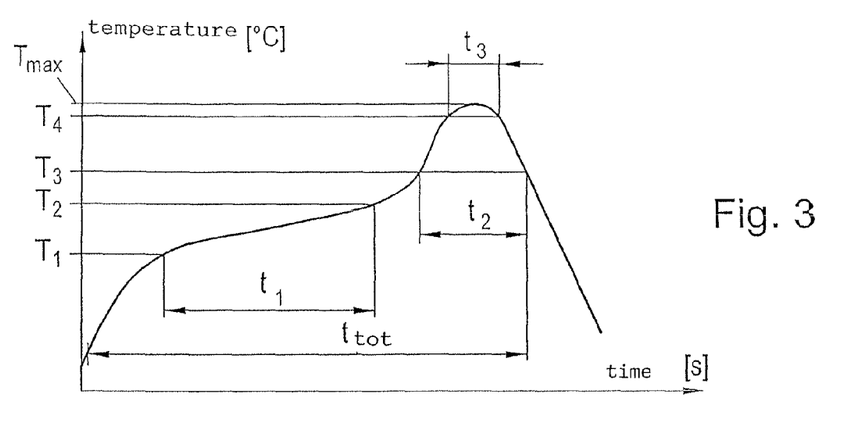
FIG. 3, in an illustration similar to that of FIG. 2, shows a modified time-temperature diagram for a heat treatment according to the invention, of a frame or support element.

FIG. 3 depicts a modified time-temperature diagram for a heat treatment of the material for the frame or support element, wherein, in modification to the diagram depicted in FIG. 2, it is apparent that, instead of a substantially uniform heating of the material for the frame or support element, different heating rates, particularly for the range between 140° C. and 180° C., as well as subsequent heating to the maximum temperature have been selected.

The parameters selected in the time-temperature diagram of FIG. 3 are as follows:

$T_1$ 150° C.
$T_2$ 180° C.
$T_3$ 215° C.
$T_{max}$ 255° C.
$t_1$ 120 to 180 seconds
$t_2$ at least 65 seconds
$t_3$ at least 10 seconds
Total time $t_{tot}$ 40° C. to 220° C.; at least 200 seconds.
Cooling rate: 5° C./s at the most.

The time-temperature diagram illustrated in FIG. 3 is similar to the temperature control usually applied in the subsequent production of a printed circuit board and, in particular, during a soldering or reflow process, when mounting such printed circuit board elements.

From the illustration according to FIG. 4, it is apparent that, departing from an initial size which is indicated at cycle number "00", a dimensional change of the respective plurality of simultaneously treated frame or support elements is achievable after having carried out two heat-treatment cycles, in particular, according to the time-temperature diagram of FIG. 3, said dimensional change, if at all, merely occurring in the deviation range of the examined materials for the frame or support elements, even in further cycles. The dimensional changes were measured based on the standardized starting material illustrated in FIG. 1 after 2, 12, 22, 32 and 52 heat-treatment cycles.

From FIG. 4, it is apparent that a substantially unchanged stability of the dimensions of the material for the frame or support element is already achievable after two heat-treatment cycles, the addition "*" at two cycles indicating that no further dimensional changes of the material for the frame or support element are to be expected after such a dual or double heat treatment, so that an accordingly dimensionally stable frame or support element will be provided.

In particular, when considering the fact that the time-temperature diagram represented in FIG. 3 is similar to a temperature control or heat treatment in the production of printed circuit boards in subsequent soldering or reflow processes when mounting printed circuit boards, it can, moreover, be directly derived from the illustration according to FIG. 4 that, during subsequent processing steps in the production of printed circuit boards following the coupling or connecting of such heat-treated frame or support elements with printed circuit board elements, no dimensional changes of the frame or support elements, and hence the mutual arrangement of a plurality of printed circuit board elements, will have to be expected after a double heat treatment or pre-treatment of the frame or support elements to be used, if accordingly elevated temperature are applied.

The provision of the dimensionally stable frame or support elements will consequently enable the connection or coupling of an extremely large number of printed circuit board elements with such frame or support elements and the subjection to collective treatment or processing steps, in particular mounting. Bearing in mind the increased dimensional stability also of the frame or support elements, rejects will be reduced even at the simultaneous use of an extremely large number of printed circuit board elements, so that the costs for the production of individual printed circuit board elements will thus also be reduced accordingly.

From the diagram according to FIG. 5, it is apparent that, after first and second heat treatments of the frame or support elements, which are respectively denoted by "01" and "02" and, for instance, correspond to the time-temperature diagram illustrated in FIG. 3, over a period of at least 48 hours, a suitable dimensional stability of the treated frame or support elements will be maintained.

It has been demonstrated that the dimensional stability achieved by the heat treatment will only decrease again after a further storage of such heat-treated frame or support elements for a period of some days or weeks at ambient conditions.

From the diagram according to FIG. 5, it may thus be derived that the coupling or connection of the heat-treated frame or support elements with printed circuit board elements for further treatment or processing will favorably have to be realized within few days and, in particular, within 48 hours in order to retain the advantages to be reached by the dimensional stability of the treated frame or support elements.

If an immediate treatment or processing upon connecting or coupling with printed circuit board elements is not possible or not provided, a deterioration of the dimensional stability may be prevented in that an air-tight packaging excluding moisture, and storing of the heat-treated frame or support elements, are likewise effected within a comparatively short period of time following the heat treatment and, more favorably, after a maximum of 48 hours, whereupon the heat-treated frame or support elements may, for instance, be supplied to a possibly extended and, in particular, months-long storage prior to further use in the context of the production of printed circuit boards.

After such storage of frame or support elements, it is again to be borne in mind that the connection of the frame or support elements with printed circuit board elements to be further processed is to be effected within a comparatively short period of time, e.g. some hours, following the removal from an air-tight package.

A frame or support element which was subjected to a temperature treatment in accordance with the above remarks exhibits the indicated dimensional stability at the dimensions cited below.

From an array or panel size, which is given by the dimensions of the frame element, of e.g. 230×142 mm, a diagonal of 270 mm will result. At a required accuracy of e.g. ±50 µm before and after subsequent processing or treatment steps, after the reception of a plurality of printed circuit board elements, e.g. after reflow processes, a dimensional stability of the frame or support element of ±0.0185% will thus be required at a process capability of 4 Sigma.

Figure 6:
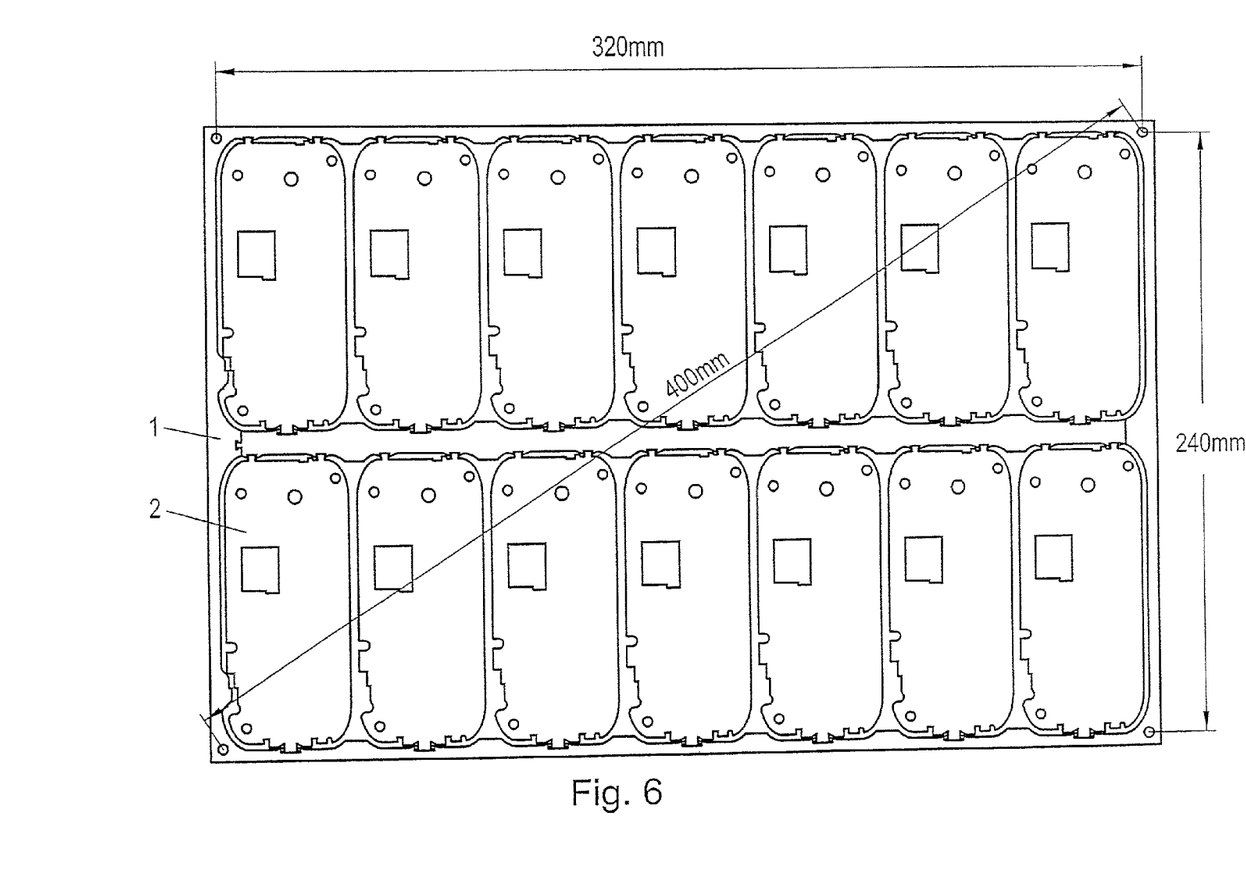
FIG. 6 is a schematic top view on a frame or support element according to the invention, including a plurality of printed circuit board elements coupled thereto.

According to a modified embodiment of a frame or support element 1 for providing an array or panel for the reception of a plurality of schematically indicated printed circuit board elements 2 having dimensions of 320×240 mm as indicated in FIG. 6, a resulting diagonal of 400 mm will be obtained.

At a maximum deviation of ±30 µm required for high-precision applications before and after subsequent processing steps, e.g. reflow processes, after the reception of a plurality of printed circuit board elements 2, a required dimensional stability of the frame or support element 1 of 0.0075% will thus result at a process capability of 4 Sigma.

The invention claimed is:
1. A method comprising:
  providing a frame or support element for use in the production of a printed circuit board;

subjecting the frame or support element to a heat treatment at temperatures of between 120° C. and 350° C. for a period of 5 to 300 seconds;

wherein immediately after the heat treatment, the frame or support element is connected or coupled with at least one printed circuit board element and subjected to processing of the printed circuit board element at elevated temperature together with the printed circuit board element or the frame or support element, after the heat treatment and prior to coupling with a printed circuit board element, is hermetically packaged, under the exclusion of moisture, and stored;

wherein the frame or support element is dimensionally stable for at least 48 hours after the heat treatment.

2. The method according to claim 1, wherein the frame or support element is subjected to a heat treatment at a temperature of at least 210° C. for a period of 40 to 100 seconds.

3. The method according to claim 2, where the heat treatment lasts for at least 60 seconds.

4. The method according to claim 1, wherein the frame or support element is subjected to a heat treatment at a temperature of at least 250° C. for a period of at least 10 seconds.

5. The method according to claim 1, wherein the frame or support element is subjected to a heat treatment at a temperature of at least 140° C. for a period of at least 100 seconds prior to further heating to at least 210° C.

6. The method according to claim 5, where the frame or support element is subjected to the heat treatment at temperatures of between 150° C. and 180° C. for 120 to 180 seconds.

7. The method according to claim 1, wherein the frame or support element, after a heat treatment at a maximum temperature, is cooled at a cooling rate of 3° C./s to 7° C./s.

8. The method according to claim 7, where the frame or support element is cooled at a cooling rate of 5° Cis at the most.

9. The method according to claim 1, wherein the frame or support element is subjected to a multiple heat treatment with intermediate cooling.

10. The method according to claim 1, wherein the frame or support element, prior to the heat-treatment, is subjected to pressing and curing and/or assembled of several layers of a starting material.

11. The method according to claim 1, wherein a full-surface or plate-shaped base material is subjected to the heat treatment, and that the frame or support element, after cooling of the plate-shaped base material, is formed out of the same.

12. The method according to claim 1, wherein the frame or support element, after the heat treatment and prior to coupling with a printed circuit board element is vacuum-packed and stored.

13. The method according to claim 1, wherein a connection or coupling of the frame or support element with a printed circuit board element, or packaging of the frame or support element, is effected after a maximum period of 72 hours following the heat treatment.

14. The method according to claim 1, wherein the frame or support element is formed of a material suitable for the production of a printed circuit board element.

15. The frame or support element for use in the production of a printed circuit board, wherein the frame or support element, after subjecting the frame or support element to the heat treatment according to claim 1, is coupleable with at least one printed circuit board element and employable in at least one processing step, at elevated temperature, together with the printed circuit board element, and that the frame or support element comprises a dimensional stability of above ±0.02%.

16. The frame or support element according to claim 15, wherein the frame or support element is formed of a material suitable for the production of a printed circuit board element.

17. The frame or support element according to claim 16, wherein the frame or support element is a glass-fiber mat material impregnated with an epoxy resin.

18. The frame or support element according to claim 15, wherein the frame or support element comprises a dimensional stability of above 0.0075% at elevated temperatures.

19. The method according to claim 1, where the frame or support element is subjected to the heat treatment at temperatures of between 200° C. to 300° C. for 10 to 200 seconds.

* * * * *